(12) United States Patent
Feng

(10) Patent No.: US 11,538,380 B2
(45) Date of Patent: Dec. 27, 2022

(54) SHIFT REGISTER, DRIVING METHOD THEREFOR, GATE DRIVING CIRCUIT AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Xuehuan Feng, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 482 days.

(21) Appl. No.: 16/621,734

(22) PCT Filed: Mar. 25, 2019

(86) PCT No.: PCT/CN2019/079595
§ 371 (c)(1),
(2) Date: Dec. 12, 2019

(87) PCT Pub. No.: WO2019/201060
PCT Pub. Date: Oct. 24, 2019

(65) Prior Publication Data
US 2020/0126467 A1   Apr. 23, 2020

(30) Foreign Application Priority Data

Apr. 20, 2018  (CN) .......................... 201810358665.8

(51) Int. Cl.
*G11C 19/28*  (2006.01)
*G09G 3/36*  (2006.01)
(Continued)

(52) U.S. Cl.
CPC ............. *G09G 3/20* (2013.01); *G09G 3/3266* (2013.01); *G09G 3/3677* (2013.01);
(Continued)

(58) Field of Classification Search
CPC ........ G11C 19/184; G11C 19/28; G09G 3/20; G09G 3/3266; G09G 3/3677; G09G 2300/0408; G09G 2310/0286
See application file for complete search history.

(56) References Cited

U.S. PATENT DOCUMENTS 11,222,565 B2 * 1/2022 Feng ...................... G11C 19/28
2008/0056430 A1   3/2008 Chang et al.
(Continued)

FOREIGN PATENT DOCUMENTS

CN  103943055 A  7/2014
CN  104575396 A  4/2015
(Continued)

OTHER PUBLICATIONS

Chinese Office Action dated Nov. 27, 2019 in related Chinese Application No. 201810358665.8.
(Continued)

*Primary Examiner* — Patrick O Neill
(74) *Attorney, Agent, or Firm* — ArentFox Schiff LLP; Michael Fainberg

(57) ABSTRACT

A shift register, a driving method therefor, a gate driving circuit and a display device. The shift register comprises: an input module, a first reset module, a second reset module, an output module. The input module is configured to write input signal of a signal input terminal STU into second node Q2 through second clock signal terminal CLKB, and to connect Q2 with first node Q1 through STU. The first reset module is configured to write signal of first direct current signal terminal into third node Q3 through STU, and to write
(Continued)

reset signal of reset signal terminal STD into Q3 and connect Q2 with Q1 through STD. The second reset module is configured to write a signal of the first direct current signal terminal into a signal output terminal OUT through Q3. The output module is configured to write a first clock signal of CLKA into OUT through Q1.

12 Claims, 10 Drawing Sheets

(51) Int. Cl.
*G09G 3/20* (2006.01)
*G11C 19/18* (2006.01)
*G09G 3/3266* (2016.01)

(52) U.S. Cl.
CPC ............ *G11C 19/184* (2013.01); *G11C 19/28* (2013.01); *G09G 2300/0408* (2013.01); *G09G 2310/0286* (2013.01)

(56) References Cited

U.S. PATENT DOCUMENTS

| | | |
|---|---|---|
| 2009/0278785 A1 | 11/2009 | Chin-Cheng |
| 2016/0274713 A1 | 9/2016 | Zhang et al. |
| 2016/0351128 A1 | 12/2016 | Li |
| 2016/0372031 A1 | 12/2016 | Li |
| 2019/0088226 A1 | 3/2019 | Cheng et al. |
| 2020/0126467 A1 | 4/2020 | Feng |

FOREIGN PATENT DOCUMENTS

| | | |
|---|---|---|
| CN | 104821153 A | 8/2015 |
| CN | 106952604 A | 7/2017 |
| CN | 107248390 A | 10/2017 |
| CN | 107452318 A | 12/2017 |
| CN | 108538233 A | 9/2018 |

OTHER PUBLICATIONS

Chinese Office Action dated Jun. 11, 2020 in related Chinese Application No. 201810358665.8.

* cited by examiner

In an input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node ⟶ S301

In an output stage, the output module writes the first clock signal of the first clock signal terminal into the signal output terminal under the control of the first node ⟶ S302

In a reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; and the second reset module writes the signal of the first DC signal terminal into the signal output terminal under the control of the third node ⟶ S303

Fig. 3

In the input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node ⟶ S701

In the output stage, the output module writes the first clock signal of the first clock signal terminal into the signal output terminal under the control of the first node; and the output control module pulls up the level difference between the first node and the signal output terminal under the control of the second DC signal terminal ⟶ S702

In the reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; the second reset module writes the signal of the first DC signal terminal into the signal output terminal under the control of the third node; and the output control module pulls down the level difference between the first node and the signal output terminal under the control of both the second clock signal terminal and the second DC signal terminal ⟶ S703

Fig. 7

In the input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node ⟵ S101

In the output stage, the output module writes the first clock signal of the first clock signal terminal into the signal output terminal under the control of the first node; and the output control module pulls up the level difference between the first node and the signal output terminal under the control of the signal output terminal ⟵ S102

In the reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; the second reset module writes the signal of the first DC signal terminal into the signal output terminal under the control of the third node; and the output control module pulls down the level difference between the first node and the signal output terminal under the control of the second clock signal terminal ⟵ S103

Fig. 10

SHIFT REGISTER, DRIVING METHOD THEREFOR, GATE DRIVING CIRCUIT AND DISPLAY DEVICE

This application is a National Stage of International Application No. PCT/CN2019/079595, filed on Mar. 25, 2019, which claims the priority of Chinese Patent Application No. 201810358665.8, filed with the Chinese Patent Office on Apr. 20, 2018, and entitled "A shift register, a method for driving the same, a gate driver circuit, and a display device", both of which are hereby incorporated by reference in their entireties.

FIELD

This disclosure relates to the field of display technologies, and particularly to a shift register, a driving method therefor, a gate driving circuit, and a display device.

BACKGROUND

At present, as the field of display technologies is developing rapidly, there is a demand for a lower cost of a display panel, so the competitiveness of a panel manufacturer depends upon its solution to a lower cost of fabricating its display panels. In order to lower a cost of fabricating a display panel, those skilled in the art may design a gate driver circuit at the edge of the display panel, where the gate driver circuit includes a plurality of shift registers, and each row of shift registers control a corresponding row of pixels to display an image in a display stage. The respective shift registers are connected with each other in such a way that after a preceding level of shift register receives a signal, shifts the signal, and then passes an output signal to a succeeding level of shift register so that a row-wise scan function can be performed. This design can dispense with a plurality of gate driver chips arranged in an edge area of the display panel to thereby design the display panel with a narrow bezel, lower a cost of fabricating the display panel, and improve the competitiveness of the product.

SUMMARY

An embodiment of this disclosure provides a shift register including: an input module, a first reset module, a second reset module, and an output module, wherein:

the input module is coupled respectively with a signal input terminal, a second clock signal terminal, a first node, and a second node, and configured to write an input signal of the signal input terminal into the second node under the control of the second clock signal terminal, and to connect the second node with the first node under the control of the signal input terminal;

the first reset module is coupled respectively with the signal input terminal, a first DC signal terminal, a reset signal terminal, the first node, the second node, and a third node, and configured to write a signal of the first DC signal terminal into the third node under the control of the signal input terminal, to write a reset signal of the reset signal terminal into the third node under the control of the reset signal terminal, and to connect the second node with the first node;

the second reset module is coupled respectively with the signal output terminal, the first DC signal terminal, and the third node, and configured to write the signal of the first DC signal terminal into the signal output terminal under the control of the third node; and the output module is coupled respectively with a first clock signal terminal, the signal output terminal, and the first node, and configured to write a first clock signal of the first clock signal terminal into the signal output terminal under the control of the first node.

Based upon the same inventive idea, an embodiment of this disclosure further provides a gate driver circuit including a plurality of concatenated shift registers above, wherein:

the signal input terminal of the first level of shift register is connected with a frame trigger signal terminal;

signal input terminals of other levels of shift registers than a first level of shift register are connected respectively with the signal output terminals of their immediately preceding levels of shift register; and reset signal terminals of other levels of shift registers than a last level of shift register are connected respectively with the concatenated signal output terminals of their immediately succeeding levels of shift registers.

Based upon the same inventive idea, an embodiment of this disclosure further provides a display device including the gate driver circuit above.

Correspondingly an embodiment of this disclosure further provides a method for driving the shift register above, the method including:

in an input stage, writing, by the input module, the input signal of the signal input terminal into the second node under the control of the second clock signal terminal, and connecting the second node with the first node under the control of the signal input terminal to write the input signal of the signal input terminal into the first node through the second node; writing, by the first reset module, the signal of the first DC signal terminal into the third node under the control of the signal input terminal; and writing, by the output module, the first clock signal of the first clock signal terminal into the signal output terminal under the control of the first node;

in an output stage, writing, by the output module, the first clock signal of the first clock signal terminal into the signal output terminal under the control of the first node; and in a reset stage, writing, by the input module, the input signal of the signal input terminal into the second node under the control of the second clock signal terminal; writing, by the first reset module, the reset signal of the reset signal terminal into the third node, and connecting the second node with the first node, under the control of the reset signal terminal; and writing, by the second reset module, the signal of the first DC signal terminal into the signal output terminal under the control of the third node.

BRIEF DESCRIPTION OF THE DRAWINGS

FIG. 3 is a flow chart of a method for driving the shift register as illustrated in FIG. 2;

FIG. 7 is a flow chart of a method for driving the shift register as illustrated in FIG. 5;

FIG. 10 is a flow chart of a method for driving the shift register as illustrated in FIG. 8.

DETAILED DESCRIPTION OF THE EMBODIMENTS

Particular implementations of the shift register, the method for driving the same, the gate driver circuit, and the display device according to the embodiments of this disclosure will be described below in details with reference to the drawings. It shall be noted that the embodiments described in this specification are only a part but not all of the embodiments of this disclosure, and the embodiments of this disclosure, and the features in the embodiments can be combined with each other unless they conflict with each other. Moreover based upon the embodiments of this disclosure, all the other embodiments which can occur to those ordinarily skilled in the art without any inventive effort shall fall into the claimed scope of this disclosure.

Figure 1:
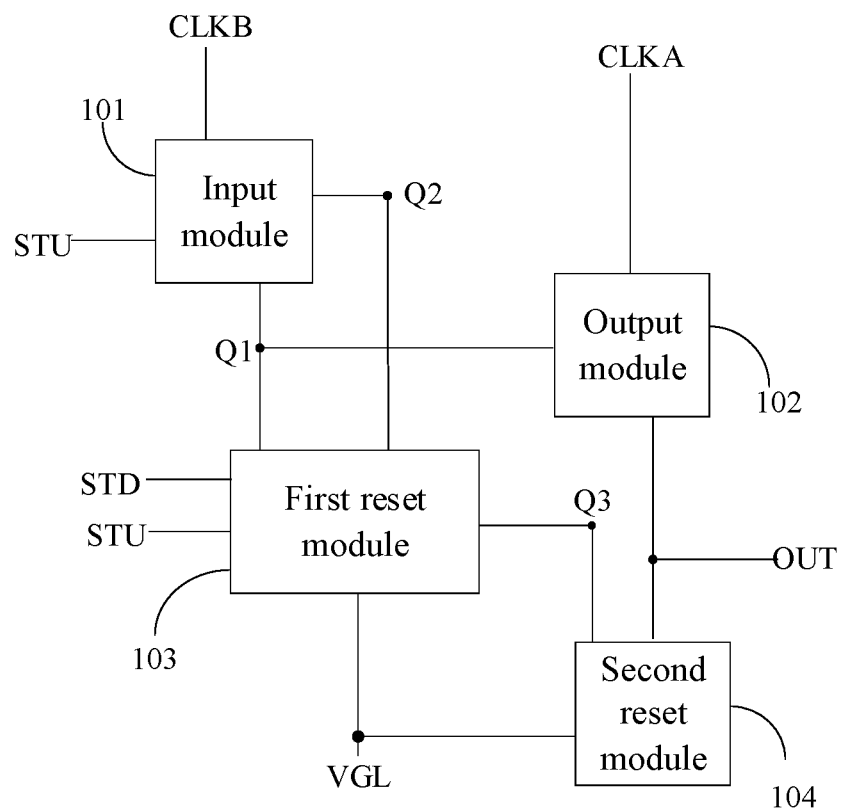
FIG. 1 is a schematic structural diagram of a shift register according to a first embodiment of this disclosure.

As illustrated in FIG. 1, a shift register according to an embodiment of this disclosure includes: an input module 101, an output module 102, a first reset module 103, and a second reset module 104.

The input module 101 is coupled respectively with a signal input terminal STU, a second clock signal terminal CLKB, a first node Q1, and a second node Q2, and configured to write an input signal of the signal input terminal STU into the second node Q1 under the control of the second clock signal terminal CLKB, and to connect the second node Q2 with the first node Q1 under the control of the signal input terminal STU.

The first reset module 103 is coupled respectively with the signal input terminal STU, a first DC signal terminal VGL, a reset signal terminal STD, the first node Q1, the second node Q2, and a third node Q3, and configured to write a signal of the first DC signal terminal VGL into the third node Q3 under the control of the signal input terminal STU, to write a reset signal of the reset signal terminal STD into the third node Q3 under the control of the reset signal terminal STD, and to connect the second node Q2 with the first node Q1.

The second reset module 104 is coupled respectively with the signal output terminal OUT, the first DC signal terminal VGL, and the third node Q3, and configured to write the signal of the first DC signal terminal VGL into the signal output terminal under the control of the third node Q3.

The output module 102 is coupled respectively with a first clock signal terminal CLKA, the signal output terminal OUT, and the first node, and configured to write a first clock signal of the first clock signal terminal CLKA into the signal output terminal OUT under the control of the first node Q1.

In the shift register above according to some embodiments of this disclosure, the first reset module is coupled respectively with the signal input terminal, the first DC signal terminal, the reset signal terminal, the first node, the second node, and the third node, and configured to write the signal of the first DC signal terminal into the third node under the control of the signal input terminal, to write the reset signal of the reset signal terminal into the third node, and to connect the second node with the first node, under the control of the reset signal terminal; and the signal of the reset signal terminal can be avoided from interfering with the input signal, due to the arrangement of the first reset module.

The shift register above according to some embodiments of this disclosure will be described below in details in connection with particular embodiments thereof. It shall be noted that the particular embodiments are intended to better set forth this disclosure, but not to limit this disclosure thereto.

Figure 2:
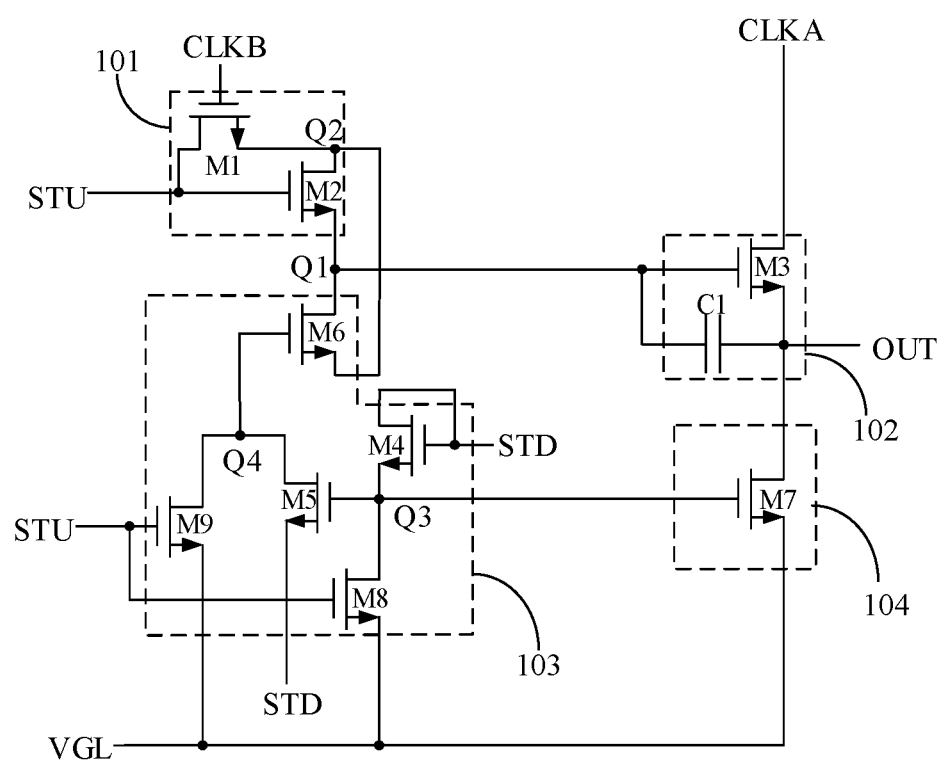
FIG. 2 is a schematic structural diagram in details of the shift register as illustrated in FIG. 1.

Optionally, in the shift register according to some embodiments of this disclosure, as illustrated in FIG. 2, the input module 101 includes a first switch transistor M1 and a second switch transistor M2.

The first switch transistor M1 has a gate connected with the second clock signal terminal CLKB, a first electrode connected with the signal input terminal STU, and a second electrode connected with the second node Q2.

The second switch transistor M2 has a gate connected with the signal input terminal STU, a first electrode connected with the second node Q2, and a second electrode connected with the first node Q1.

The particular structure of the input module in the shift register has been described above only by way of an example, and in a particular implementation, the particular structure of the input module will not be limited to the structure above according to some embodiments of this disclosure, but can alternatively be another structure known to those skilled in the art, although some embodiments of this disclosure will not be limited thereto.

Optionally, in the shift register according to some embodiments of this disclosure, as illustrated in FIG. 2, the output module 102 includes a third switch transistor M3 and a first capacitor C1.

The third switch transistor M3 has a gate connected with the first node Q1, a first node connected with the first clock signal terminal CLKA, and a second electrode connected with the signal output terminal OUT.

The first capacitor C1 has one terminal connected with the first node Q1, and the other terminal connected with the signal output terminal OUT.

The particular structure of the output module in the shift register has been described above only by way of an example, and in a particular implementation, the particular structure of the output module will not be limited to the structure above according to some embodiments of this disclosure, but can alternatively be another structure known to those skilled in the art, although some embodiments of this disclosure will not be limited thereto.

Optionally, in the shift register according to some embodiments of this disclosure, as illustrated in FIG. 2, the first reset module 103 includes a fourth switch transistor M4, a fifth switch transistor M5, a sixth switch transistor M6, an eighth switch transistor M8, and a ninth switch transistor M9.

The fourth switch transistor M4 has a gate and a first electrode, both of which are connected with the reset signal terminal STD, and a second electrode connected with the third node Q3.

The fifth switch transistor M5 has a gate connected with the third node Q3, a first electrode connected with the reset signal terminal STD, and a second electrode connected with a fourth node Q4.

The sixth switch transistor M6 has a gate connected with the fourth node Q4, a first electrode connected with the second node Q2, and a second electrode connected with the first node Q1.

The eighth switch transistor M8 has a gate connected with the signal input terminal STU, a first electrode connected with the first DC signal terminal VGL, and a second electrode connected with the third node Q3.

The ninth switch transistor M9 has a gate connected with the signal input terminal STU, a first electrode connected with the first DC signal terminal VGL, and a second electrode connected with the fourth node Q4.

The eighth switch transistor M8 has a larger width to length ratio than that of the fourth switch transistor M4.

The particular structure of the first reset module in the shift register has been described above only by way of an example, and in a particular implementation, the particular structure of the first reset module will not be limited to the structure above according to some embodiments of this disclosure, but can alternatively be another structure known to those skilled in the art, although some embodiments of this disclosure will not be limited thereto.

Optionally, in the shift register according to some embodiments of this disclosure, as illustrated in FIG. 2, the second reset module 104 includes a seventh switch transistor M7.

The seventh switch transistor M7 has a gate connected with the third node Q3, a first electrode connected with the first DC signal terminal VGL, and a second electrode connected with the signal output terminal OUT.

The particular structure of the second reset module in the shift register has been described above only by way of an example, and in a particular implementation, the particular structure of the second reset module will not be limited to the structure above according to some embodiments of this disclosure, but can alternatively be another structure known to those skilled in the art, although some embodiments of this disclosure will not be limited thereto.

It shall be noted that the switch transistors mentioned in the particular embodiment above of this disclosure can be Thin Film Transistors (TFTs), or can be Metal Oxide Semiconductor Field-Effect Transistors (MOSFETs), although some embodiments of this disclosure will not be limited thereto.

Moreover in a particular implementation, the first electrodes and the second electrodes of these switch transistors are sources and drains respectively, and can be interchanged in function with each other dependent their different transistor types and input signals instead of being particularly defined here.

Based upon the same inventive idea, according to some embodiments of this disclosure, an embodiment of this disclosure further provides a method for driving the shift register above according to some embodiments of this disclosure, and as illustrated in FIG. 3, the method particularly can include the following steps:

in the step S301, in an input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node;

in the step S302, in an output stage, the output module writes the first clock signal of the first clock signal terminal into the signal output terminal under the control of the first node; and in the step S303, in a reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; and the second reset module writes the signal of the first DC signal terminal into the signal output terminal under the control of the third node.

In the shift register according to some embodiments of this disclosure, the first clock signal is opposite in phase to the second clock signal, that is, when the first clock signal is at a high level, the second clock signal is at a low level; and when the first clock signal is at a low level, the second clock signal is at a high level.

It shall be noted that in the shift register above according to some embodiments of this disclosure, when an active pulse signal of the input signal terminal is a high-level signal, voltage at the first DC signal terminal is at a low level, and all the switch transistors are N-type transistors in the shift register as illustrated in FIG. 2; and when an active pulse signal of the input signal terminal is a low-level signal, the voltage at the first DC signal terminal is at a high level, and all the switch transistors are P-type transistors in the shift register.

In order to better understand the technical solution according to some embodiments of this disclosure, an operating process of the shift register in the particular structure as illustrated in FIG. 2 will be described below.

Figure 4:
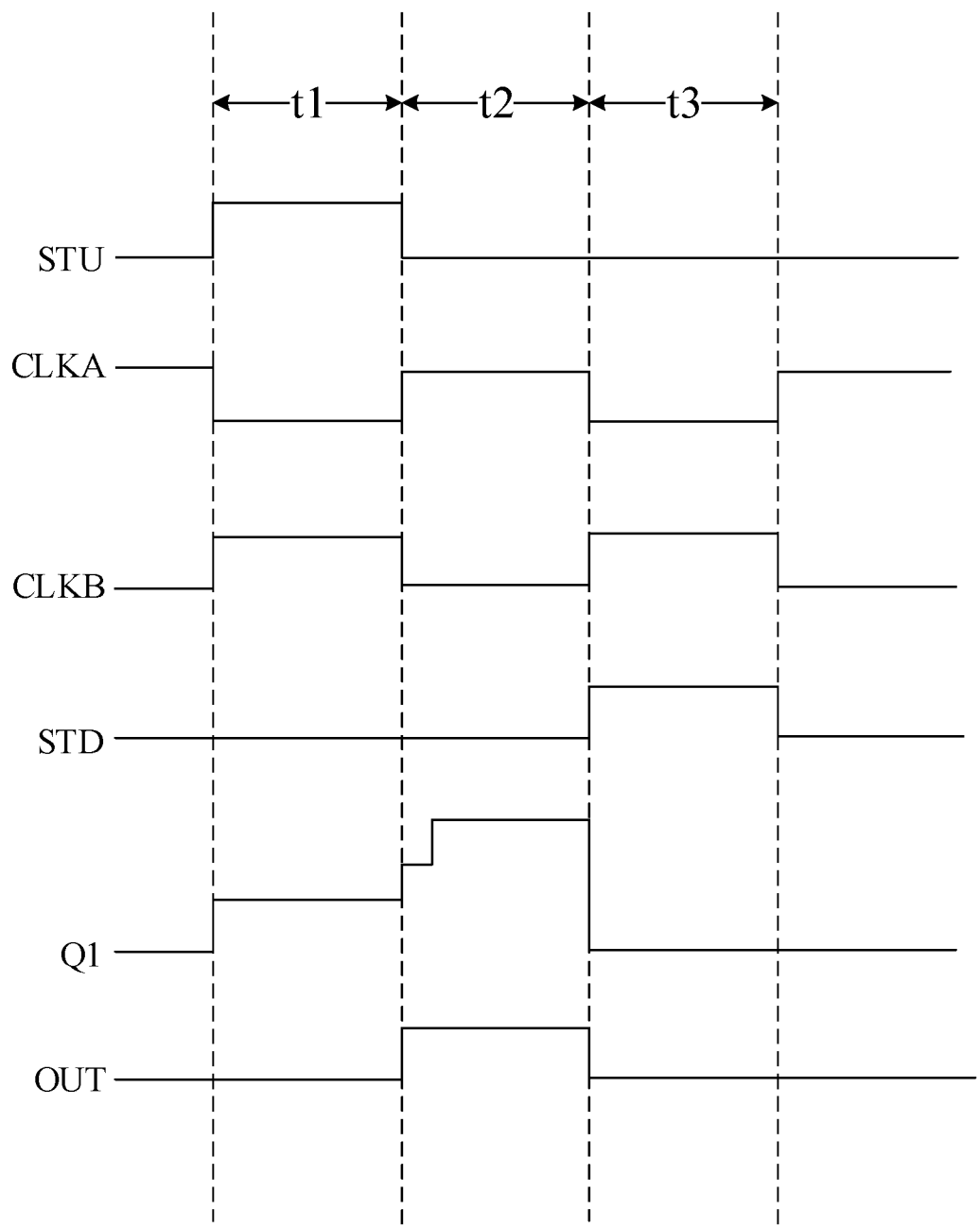
FIG. 4 is an operating timing diagram of the shift register according to some embodiments of this disclosure.

In the shift register as illustrated in FIG. 2, all the switch transistors are N-type transistors, and the respective N-type transistors are switched on at a high level, and switched off at a low level; and FIG. 4 illustrates a corresponding operating timing diagram thereof, and optionally an input stage t1, an output stage t2, and a reset stage t3 in the operating timing diagram as illustrated in FIG. 4 will be described in details by way of an example.

In the input stage t1, the signal input terminal STU outputs a high level, the reset signal terminal STD outputs a low level, the first clock signal terminal CLKA outputs a low level, and the second clock signal terminal CLKB outputs a high level.

The first switch transistor M1 is switched on by the high level of the second clock signal terminal CLKB, and the second switch transistor M2 is switched on by the high level of the signal input terminal STU, so that the first node Q1 is set to the high level of the signal input terminal STU. The third switch transistor M3 is switched on by the high level of the first node Q1, and the signal output terminal OUT outputs the low level of the first clock signal terminal CLKA.

The ninth switch transistor M9 is switched on by the high level of the signal input terminal STU so that the gate of the sixth switch transistor M6 (i.e., the fourth node Q4) is pulled to the low level by the first DC signal terminal VGL; and the eighth switch transistor M8 is switched on by the high level of the signal input terminal STU, and normally the fourth switch transistor M4 is switched off by the low level of the reset signal terminal STD, so the gate of the fifth switch transistor M5 (i.e., the third node Q3) is pulled to the low level by the first DC signal terminal VGL, so the fifth switch transistor M5 is switched off so that the gate of the sixth switch transistor M6 remains at a low level, and thus will not interfere with the input signal. Even if the reset signal of the reset signal terminal STD is changed to a high level by accident due to some noise so that the fourth switch transistor M4 is switched on, then since the width to length ratio of the eight switch transistor M8 is larger than that of the fourth switch transistor M4, the gate of the fifth switch transistor M5 is still pulled to the low level by the first DC signal terminal VGL so that the fifth switch transistor M5 is switched off, so the reset signal changed to the high level by accident will not be written into the gate of the sixth switch transistor M6 through the fifth switch transistor M5 which is switched off, and thus the gate of the sixth switch transistor M6 remains at the low level, and thus will not interfere with the input signal.

In the output stage t2, the signal input terminal STU outputs a low level, the reset signal terminal STD outputs a low level, the first clock signal terminal CLKA outputs a high level, and the second clock signal terminal CLKB outputs a low level.

The first node Q1 remains at the high level at the end of the first stage, and the third switch transistor Q3 remains switched off; and the signal output terminal OUT outputs the high level of the first clock signal terminal CLKA.

In the reset stage t3, the signal input terminal STU outputs a low level, the reset signal terminal STD outputs a high level, the first clock signal terminal CLKA outputs a low level, and the second clock signal terminal CLKB outputs a high level.

The first switch transistor M1 is switched on by the high level of the second clock signal terminal CLKB so that the source of the sixth switch transistor M6 is pulled down to the low level of the signal input terminal STU.

The fourth switch transistor M4 is switched on by the high level of the reset signal terminal STD, the eighth switch transistor M8 is switched off by the low level of the signal input terminal STU, and the gates of the fifth switch transistor M5 and the seventh switch transistor M7 are pulled up to the high level of the signal input terminal STD so that both the fifth switch transistor M5 and the seventh switch transistor M7 are switched on. Since the fifth switch transistor M5 is switched on, the high level of the reset signal terminal STD is written into the gate of the sixth switch transistor M6 so that the sixth switch transistor M6 is switched on, and the first node Q1 is pulled down to the low level of the signal input terminal STU, and thus reset.

The seventh switch transistor M7 is switched on, and the signal output terminal OUT is pulled down to the low level of the first DC signal terminal VGL, and thus reset. The level of the first node Q1 is further pulled down due to bootstrapping by the first capacitor C1, and thus reset.

In a subsequent period of time, the shift register repeats the operating process from t1 to t3 above.

Figure 5:
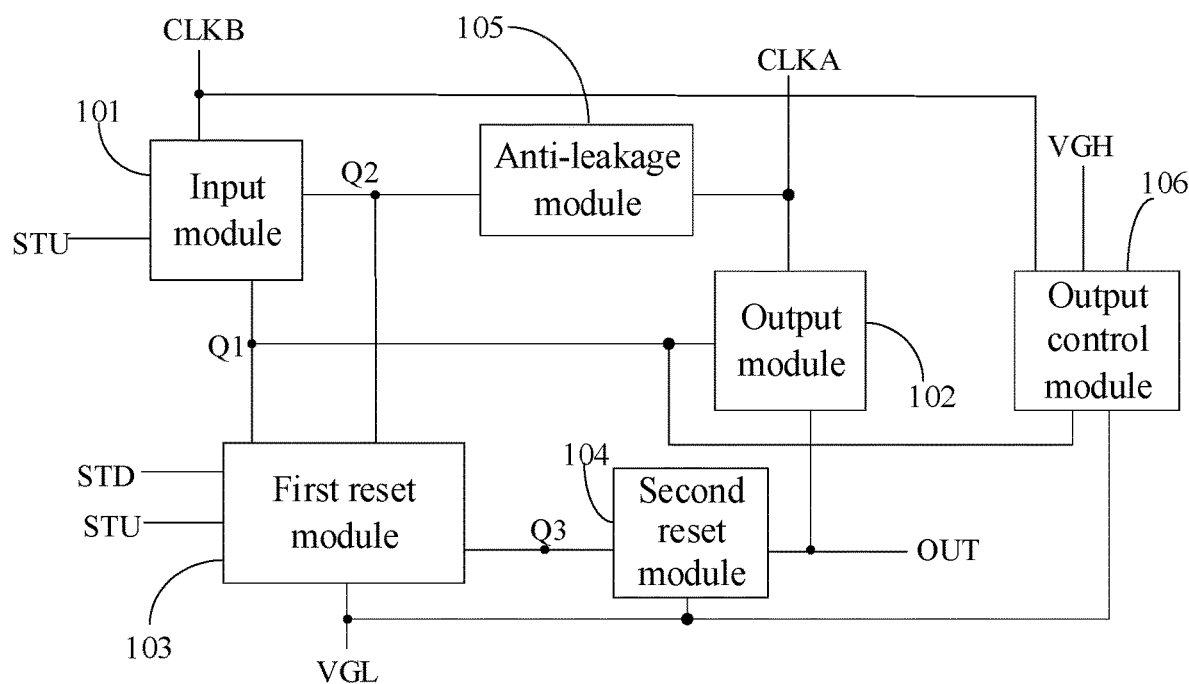
FIG. 5 is a schematic structural diagram of a shift register according to a second embodiment of this disclosure.

In order to prevent the first node from being leaked at the position where it is coupled with the input module and the first reset module, to thereby guarantee the stability of an output of the output module, optionally in the shift register according to some embodiments of this disclosure, as illustrated in FIG. 5, the shift register further includes an anti-leakage module 105.

The anti-leakage module 105 is coupled between the first clock signal terminal CLKA and the second node Q2.

The anti-leakage module 105 is configured to connect the first clock signal terminal CLKA with the second node Q2 under the control of the first clock signal terminal CLKA.

Figure 6:
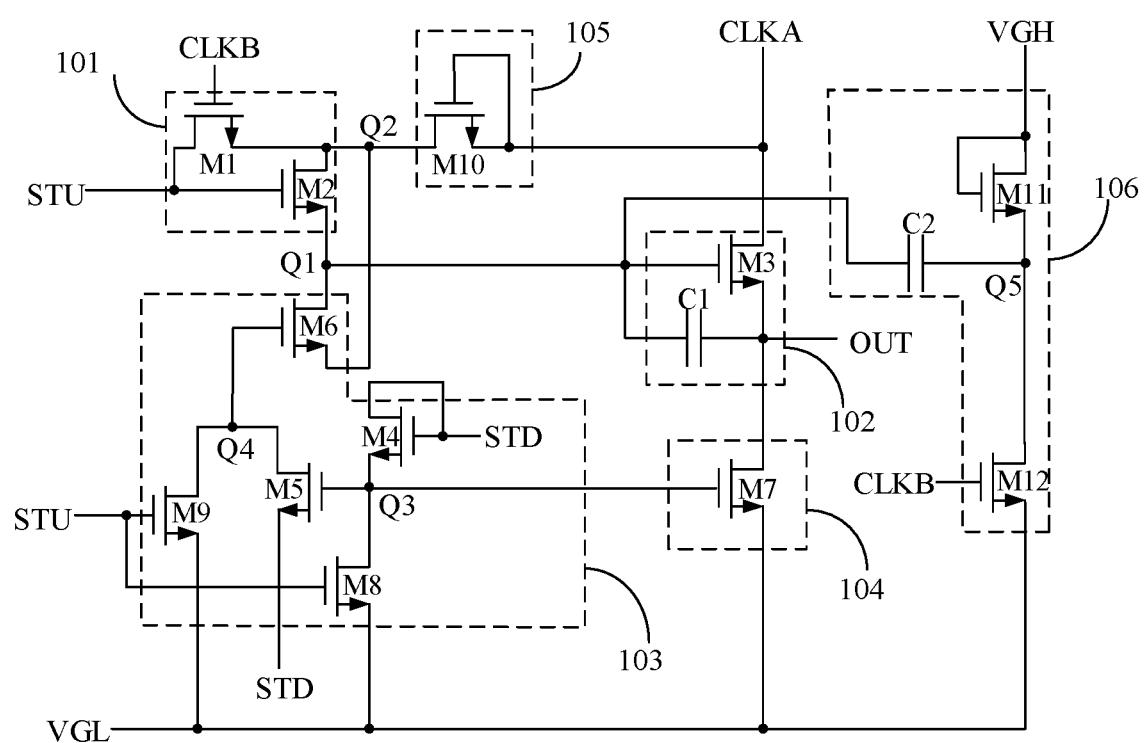
FIG. 6 is a schematic structural diagram in details of the shift register as illustrated in FIG. 5.

Optionally, in the shift register according to some embodiments of this disclosure, as illustrated in FIG. 6, the anti-leakage module includes a tenth switch transistor M10.

The tenth switch transistor M10 has a gate and a first electrode, both of which are connected with the first clock signal terminal CLKA, and a second electrode connected with the second node Q2.

In a particular implementation, the respective switch transistors in the shift register are generally oxide thin film transistors, but a transfer characteristic of an oxide thin film transistor is typically depleted, that is, when a gate-source voltage difference Vgs of the oxide thin film transistor is zero, the oxide thin film transistor has been switched on so that the oxide thin film transistor may be leaked, and thus the voltage at the gate of the oxide thin film transistor may drop; and in the output stage, if the voltage at the gate of the oxide thin film transistor drops, then there will be such instable output voltage that an image is displayed abnormally on the display panel.

Optionally, in the shift register according to some embodiments of this disclosure, as illustrated in FIG. 5, the shift register further includes an output control module 106.

The output control module 106 is coupled respectively with the first node Q1, the second clock signal terminal CLKB, the first DC signal terminal VGL, and a second DC signal terminal VGH.

The output control module 106 is configured to pull up the level difference between the first node Q1 and the signal output terminal OUT under the control of the second DC signal terminal VGH. For example, in the output stage, when the first node Q1 is at a high level, the output control module 106 further pulls up the level of the first node Q1, that is, the output control module 106 can pull up the level of the first node Q1 under the control of the second DC signal terminal VGH in the output stage so that the first node Q1 remains at the high level throughout the output stage to thereby guarantee the sufficiency and the stability of the output voltage so as to eliminate an abnormal condition in the display panel. In the output stage, when the first node Q1 is at a low level, the output control module 106 further pulls down the level of the first node Q1, that is, the output control module 106 can pull down the level of the first node Q1 under the control of the second DC signal terminal VGH in the output stage so that the first node Q1 remains at the low level throughout the output stage to thereby guarantee the sufficiency and the stability of the output voltage so as to eliminate an abnormal condition in the display panel.

The output control module 106 is configured to pull down the level difference between the first node Q1 and the signal output terminal OUT under the joint control of the second clock signal terminal CLKB and the second DC signal terminal VGH. For example, when the first node Q1 is at a high level in the output stage, the output control module 106 can pull down the level of the first node Q1 in the reset stage; and when the first node Q1 is at a low level in the output stage, the output control module 106 can pull up the level of the first node Q1 in the reset stage, so that no signal is output by the output module 102.

Optionally, in the shift register according to some embodiments of this disclosure, as illustrated in FIG. 6, the output control module 106 includes an eleventh switch transistor M11, a twelfth switch transistor M12, and a second capacitor C2.

The eleventh switch transistor M11 has a gate and a first electrode, both of which are connected with the second DC signal terminal VGH, and a second electrode connected with a fifth node Q5.

The twelfth switch transistor M12 has a gate connected with the second clock signal terminal CLKB, a first electrode connected with the first DC signal terminal VGL, and a second electrode connected with the fifth node Q5.

The second capacitor C2 has one terminal connected with the first node Q1, and the other terminal connected with the fifth node Q5.

The twelfth switch transistor M12 has a larger width to length ratio than that of the eleventh switch transistor M11.

The particular structure of the output control module in the shift register has been described above only by way of an example, and in a particular implementation, the particular structure of the output control module will not be limited to the structure above according to some embodiments of this disclosure, but can alternatively be another structure known to those skilled in the art, although some embodiments of this disclosure will not be limited thereto.

As can be appreciated, the respective switch transistors in the output control module can be Thin Film Transistors (TFTs), or can be Metal Oxide Semiconductor Field-Effect Transistors (MOSFETs), although some embodiments of this disclosure will not be limited thereto.

Moreover in a particular implementation, the first electrodes and the second electrodes of these switch transistors are sources and drains respectively, and can be interchanged in function with each other dependent their different transistor types and input signals instead of being particularly defined here.

Correspondingly an embodiment of this disclosure further provides a method for driving the shift register as illustrated in FIG. 5 and FIG. 6, and as illustrated in FIG. 7, the method particularly can include the following steps:

in the step S701, in the input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node;

in the step S702, in the output stage, the output module writes the first clock signal of the first clock signal terminal into the signal output terminal under the control of the first node; and the output control module pulls up the level difference between the first node and the signal output terminal under the control of the second DC signal terminal; and in the step S703, in the reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; the second reset module writes the signal of the first DC signal terminal into the signal output terminal under the control of the third node; and the output control module pulls down the level difference between the first node and the signal output terminal under the control of both the second clock signal terminal and the second DC signal terminal.

In order to better understand the technical solution according to some embodiments of this disclosure, an operating process of the shift register in the particular structure as illustrated in FIG. 6 will be described below.

In the shift register as illustrated in FIG. 6, all the switch transistors are N-type transistors, and the respective N-type transistors are switched on at a high level, and switched off at a low level; and FIG. 4 illustrates a corresponding operating timing diagram thereof, and optionally an input stage t1, an output stage t2, and a reset stage t3 in the operating timing diagram as illustrated in FIG. 4 will be described in details by way of an example.

In the input stage t1, the signal input terminal STU outputs a high level, the reset signal terminal STD outputs a low level, the first clock signal terminal CLKA outputs a low level, and the second clock signal terminal CLKB outputs a high level.

The first switch transistor M1 is switched on by the high level of the second clock signal terminal CLKB, and the second switch transistor M2 is switched on by the high level of the signal input terminal STU, so that the first node Q1 is set to the high level of the signal input terminal STU. The third switch transistor M3 is switched on by the high level of the first node Q1, and the signal output terminal OUT outputs the low level of the first clock signal terminal CLKA.

The ninth switch transistor M9 is switched on by the high level of the signal input terminal STU so that the gate of the sixth switch transistor M6 (i.e., the fourth node Q4) is pulled to the low level by the first DC signal terminal VGL; and the eighth switch transistor M8 is switched on by the high level of the signal input terminal STU, and normally the fourth switch transistor M4 is switched off by the low level of the reset signal terminal STD, so the gate of the fifth switch transistor M5 (i.e., the third node Q3) is pulled to the low level by the first DC signal terminal VGL, so the fifth switch transistor M5 is switched off so that the gate of the sixth switch transistor M6 remains at a low level, and thus will not interfere with the input signal. Even if the reset signal of the reset signal terminal STD is changed to a high level by accident due to some noise so that the fourth switch transistor M4 is switched on, then since the width to length ratio of the eight switch transistor M8 is larger than that of the fourth switch transistor M4, the gate of the fifth switch transistor M5 is still pulled to the low level by the first DC signal terminal VGL so that the fifth switch transistor M5 is switched off, so the reset signal changed to the high level by accident will not be written into the gate of the sixth switch transistor M6 through the fifth switch transistor M5 which is switched off, and thus the gate of the sixth switch transistor M6 remains at the low level, and thus will not interfere with the input signal.

The eleventh switch transistor M11 is switched on by the high level of the second DC signal terminal VGH, the twelfth switch transistor M12 is switched on by the high level of the second clock signal terminal CLKB, and the width to length ratio of the twelfth switch transistor M12 is larger than that of the eleventh switch transistor M11, so the fifth node Q5 is pulled to the low level by the first DC signal terminal VGL.

In the output stage t2, the signal input terminal STU outputs a low level, the reset signal terminal STD outputs a low level, the first clock signal terminal CLKA outputs a high level, and the second clock signal terminal CLKB outputs a low level.

The tenth switch transistor M10 is switched on by the high level of the first clock signal terminal CLKA so that the gates of the second switch transistor M2 and the sixth switch transistor M6 (i.e., the second node Q2) are set to a high level, and the sources of the second switch transistor M2 and the sixth switch transistor M6 (i.e., the first node Q1) are at a high level at the end of the input stage so that there are a small voltage difference in the second switch transistor M2, and also a small voltage difference in the sixth switch transistor M6, thus avoiding the first node Q1 from being leaked through the second switch transistor M2 and the sixth switch transistor M6 connected with the first node Q1 to thereby guarantee the stability of the output.

Furthermore the twelfth switch transistor M12 is switched off by the low level of the second clock signal terminal CLKB, the eleventh switch transistor M11 is still switched on by the high level of the second DC signal terminal VGH, the level of the fifth node Q5 jumps from the low level of the first DC signal terminal VGL to the high level of the second DC signal terminal VGH, and the level of the first node Q1 raises due to bootstrapping by the second capacitor C2; and the third switch transistor M3 is switched on by the high level of the first node Q1, the signal output terminal OUT outputs the high level of the first clock signal terminal CLKA, and the level of the first node Q1 is further pulled up due to bootstrapping by the first capacitor C1.

Apparently the gate of the third switch transistor M3 remains at a high level so that the signal output terminal OUT can output the high level of the first clock signal terminal CLKA stably.

In the reset stage t3, the signal input terminal STU outputs a low level, the reset signal terminal STD outputs a high level, the first clock signal terminal CLKA outputs a low level, and the second clock signal terminal CLKB outputs a high level.

The first switch transistor M1 is switched on by the high level of the second clock signal terminal CLKB so that the source of the sixth switch transistor M6 is pulled down to the low level of the signal input terminal STU.

The fourth switch transistor M4 is switched on by the high level of the reset signal terminal STD, the eighth switch transistor M8 is switched off by the low level of the signal input terminal STU, and the gates of the fifth switch transistor M5 and the seventh switch transistor M7 are pulled up to the high level of the signal input terminal STD so that both the fifth switch transistor M5 and the seventh switch transistor M7 are switched on. Since the fifth switch transistor M5 is switched on, the high level of the reset signal terminal STD is written into the gate of the sixth switch transistor M6 so that the sixth switch transistor M6 is switched on, and the first node Q1 is pulled down to the low level of the signal input terminal STU, and thus reset.

The seventh switch transistor M7 is switched on, and the signal output terminal OUT is pulled down to the low level of the first DC signal terminal VGL, and thus reset. The level of the first node Q1 is further pulled down due to bootstrapping by the first capacitor C1, and thus reset.

The eleventh switch transistor M11 is switched on by the high level of the second DC signal terminal VGH, and the twelfth switch transistor M12 is switched on by the high level of the second clock signal terminal CLKB; and since the width to length ratio of the twelfth switch transistor M12 is larger than that of the eleventh switch transistor M11, the fifth node Q5 is pulled down to the low level of the first DC signal terminal VGL, and the level of the first node Q1 is further pulled down due to bootstrapping by the second capacitor C2, and thus reset.

In a subsequent period of time, the shift register repeats the operating process from t1 to t3 above.

Figure 8:
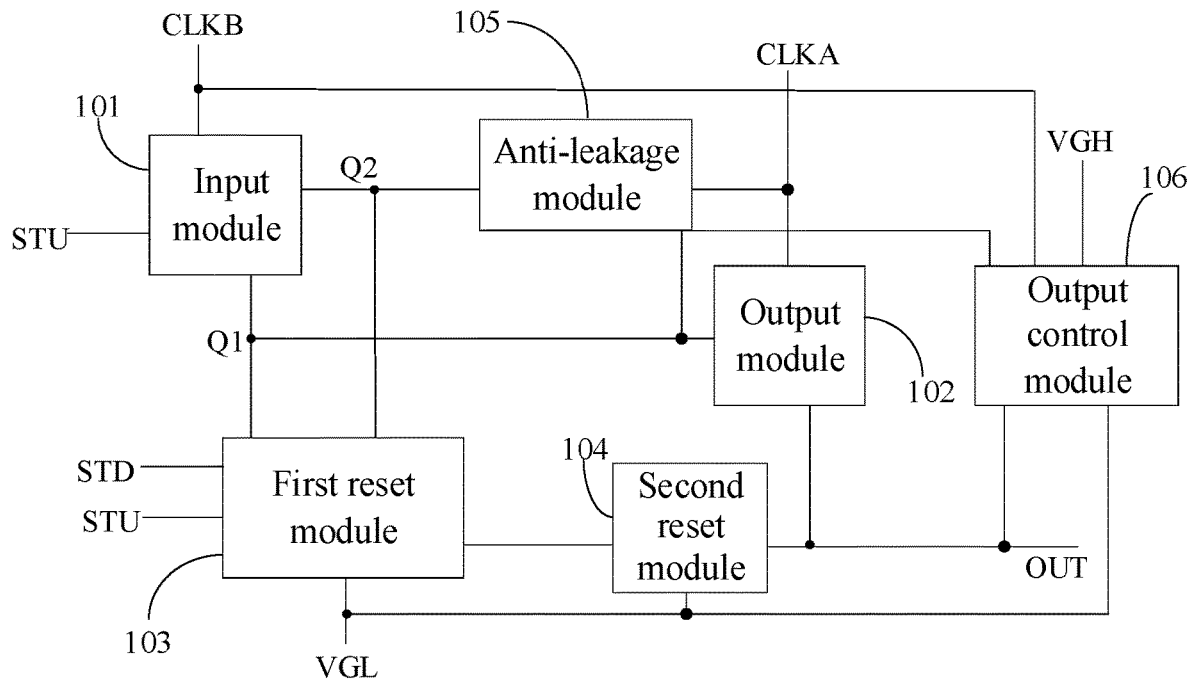
FIG. 8 is a schematic structural diagram of a shift register according to a third embodiment of this disclosure.

Alternatively, optionally in the shift register according to some embodiments of this disclosure, as illustrated in FIG. 8, the output control module 106 is coupled respectively with the first node Q1, the first clock signal terminal CLKA, the first DC signal terminal VGL, the second DC signal terminal VGH, and the signal output terminal OUT.

The output control module 106 is configured to pull up the level difference between the first node Q1 and the signal output terminal OUT under the control of the signal output terminal OUT; and for example, in the output stage, when the first node Q1 is at a high level, the output control module 106 further pulls up the level of the first node Q1, that is, the output control module 106 can pull up the level of the first node Q1 under the control of the signal output terminal OUT in the output stage so that the first node Q1 remains at the high level throughout the output stage to thereby guarantee the sufficiency and the stability of the output voltage so as to eliminate an abnormal condition in the display panel. In the output stage, when the first node Q1 is at a low level, the output control module 106 further pulls down the level of the first node Q1, that is, the output control module 106 can pull down the level of the first node Q1 under the control of the signal output terminal OUT in the output stage so that the first node Q1 remains at the low level throughout the output stage to thereby guarantee the sufficiency and the stability of the output voltage so as to eliminate an abnormal condition in the display panel.

The output control module 106 is configured to pull down the level difference between the first node Q1 and the signal output terminal OUT under the joint control of the second clock signal terminal CLKB and the second DC signal terminal VGH. For example, when the first node Q1 is at a high level in the output stage, the output control module 106 can pull down the level of the first node Q1 in the reset stage; and when the first node Q1 is at a low level in the output stage, the output control module 106 can pull up the level of the first node Q1 in the reset stage, so that no signal is output by the output module 102.

Figure 9:
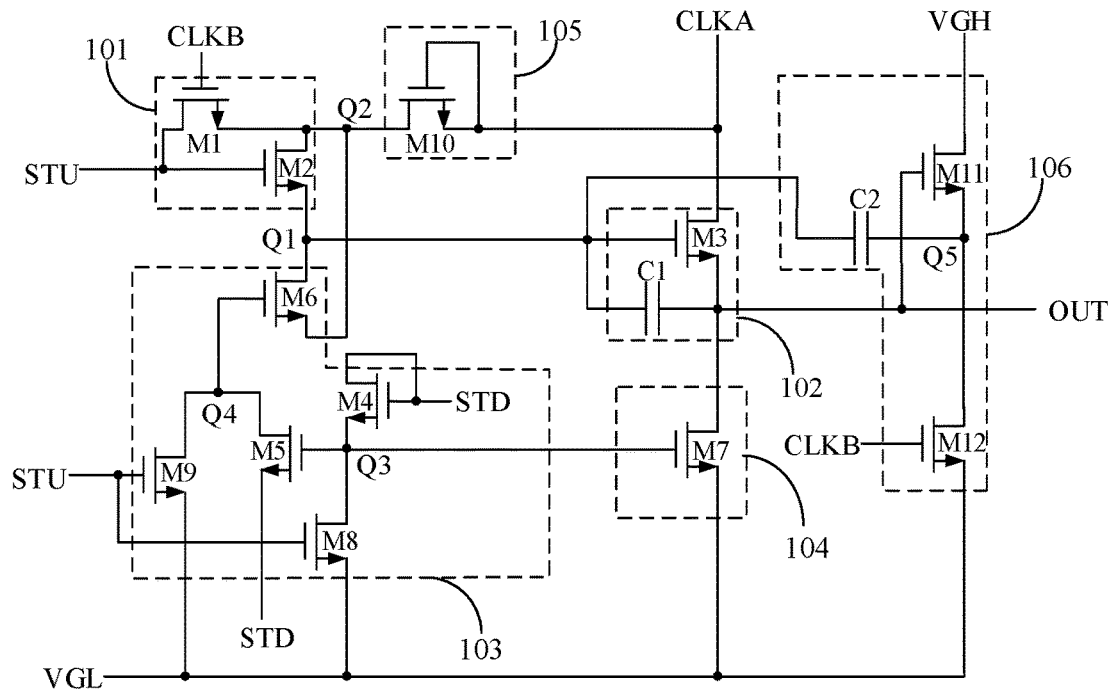
FIG. 9 is a schematic structural diagram in details of the shift register as illustrated in FIG. 8.

Optionally, in the shift register according to some embodiments of this disclosure, as illustrated in FIG. 9, the output control module 106 includes an eleventh switch transistor M11, a twelfth switch transistor M12, and a second capacitor C2.

The eleventh switch transistor M11 has a gate connected with the signal output terminal OUT, a first electrode connected with the second DC signal terminal VGH, and a second electrode connected with the fifth node Q5.

The twelfth switch transistor M12 has a gate connected with the second clock signal terminal CLKB, a first electrode connected with the first DC signal terminal VGL, and a second electrode connected with the fifth node Q5.

The second capacitor C2 has one terminal connected with the first node Q1, and the other terminal connected with the fifth node Q5.

As can be appreciated, the respective switch transistors in the output control module can be Thin Film Transistors (TFTs), or can be Metal Oxide Semiconductor Field-Effect Transistors (MOSFETs), although some embodiments of this disclosure will not be limited thereto.

Moreover in a particular implementation, the first electrodes and the second electrodes of these switch transistors are sources and drains respectively, and can be interchanged in function with each other dependent their different transistor types and input signals instead of being particularly defined here.

Correspondingly, an embodiment of this disclosure further provides a method for driving the shift register as illustrated in FIG. 8 and FIG. 9, and as illustrated in FIG. 10, the method can include the following steps:

in the step S101, in the input stage, the input module writes the input signal of the signal input terminal into the second node under the control of the second clock signal terminal, and connects the second node with the first node under the control of the signal input terminal to write the input signal of the signal input terminal into the first node through the second node; the first reset module writes the signal of the first DC signal terminal into the third node under the control of the signal input terminal; and the output module writes the first clock signal of the first clock signal terminal into the signal output terminal under the control of the first node;

in the step S102, in the output stage, the output module writes the first clock signal of the first clock signal terminal into the signal output terminal under the control of the first node; and the output control module pulls up the level difference between the first node and the signal output terminal under the control of the signal output terminal; and in the step S103, in the reset stage, the input module writes the input signal of the signal input terminal into the second node under the control of the second clock signal terminal; the first reset module writes the reset signal of the reset signal terminal into the third node, and connects the second node with the first node, under the control of the reset signal terminal; the second reset module writes the signal of the first DC signal terminal into the signal output terminal under the control of the third node; and the output control module pulls down the level difference between the first node and the signal output terminal under the control of the second clock signal terminal.

In order to better understand the technical solution according to some embodiments of this disclosure, an operating process of the shift register in the particular structure as illustrated in FIG. 9 will be described below.

In the shift register as illustrated in FIG. 9, all the switch transistors are N-type transistors, and the respective N-type transistors are switched on at a high level, and switched off at a low level; and FIG. 4 illustrates a corresponding operating timing diagram thereof, and particularly an input stage t1, an output stage t2, and a reset stage t3 in the operating timing diagram as illustrated in FIG. 4 will be described in details by way of an example.

In the input stage t1, the signal input terminal STU outputs a high level, the reset signal terminal STD outputs a low level, the first clock signal terminal CLKA outputs a low level, and the second clock signal terminal CLKB outputs a high level.

The first switch transistor M1 is switched on by the high level of the second clock signal terminal CLKB, and the second switch transistor M2 is switched on by the high level of the signal input terminal STU, so that the first node Q1 is set to the high level of the signal input terminal STU. The third switch transistor M3 is switched on by the high level of the first node Q1, and the signal output terminal OUT outputs the low level of the first clock signal terminal CLKA. The eleventh switch transistor M11 is switched off by the low level of the signal output terminal OUT, and the twelfth switch transistor M12 is switched on by the high level of the second clock signal terminal CLKB, so the fifth node Q5 is pulled to the low level by the first DC signal terminal VGL.

The ninth switch transistor M9 is switched on by the high level of the signal input terminal STU so that the gate of the sixth switch transistor M6 (i.e., the fourth node Q4) is pulled to the low level by the first DC signal terminal VGL; and the eighth switch transistor M8 is switched on by the high level of the signal input terminal STU, and normally the fourth switch transistor M4 is switched off by the low level of the reset signal terminal STD, so the gate of the fifth switch transistor M5 (i.e., the third node Q3) is pulled to the low level by the first DC signal terminal VGL, so the fifth switch transistor M5 is switched off so that the gate of the sixth switch transistor M6 remains at a low level, and thus will not interfere with the input signal. Even if the reset signal of the reset signal terminal STD is changed to a high level by accident due to some noise so that the fourth switch transistor M4 is switched on, then since the width to length ratio of the eight switch transistor M8 is larger than that of the fourth switch transistor M4, the gate of the fifth switch transistor M5 is still pulled to the low level by the first DC signal terminal VGL so that the fifth switch transistor M5 is switched off, so the reset signal changed to the high level by accident will not be written into the gate of the sixth switch transistor M6 through the fifth switch transistor M5 which is switched off, and thus the gate of the sixth switch transistor M6 remains at the low level, and thus will not interfere with the input signal.

In the output stage t2, the signal input terminal STU outputs a low level, the reset signal terminal STD outputs a low level, the first clock signal terminal CLKA outputs a high level, and the second clock signal terminal CLKB outputs a low level.

The tenth switch transistor M10 is switched on by the high level of the first clock signal terminal CLKA so that the gates of the second switch transistor M2 and the sixth switch transistor M6 (i.e., the second node Q2) are set to a high level, and the sources of the second switch transistor M2 and the sixth switch transistor M6 (i.e., the first node Q1) are at a high level at the end of the input stage so that there are a small voltage difference in the second switch transistor M2, and also a small voltage difference in the sixth switch transistor M6, thus avoiding the first node Q1 from being leaked through the second switch transistor M2 and the sixth switch transistor M6 connected with the first node Q1 to thereby guarantee the stability of the output.

Furthermore the twelfth switch transistor M12 is switched off by the low level of the second clock signal terminal CLKB, the eleventh switch transistor M11 is still switched on by the high level of the signal output terminal OUT, the level of the fifth node Q5 jumps from the low level of the first DC signal terminal VGL to the high level of the second DC signal terminal VGH, and the level of the first node Q1 raises due to bootstrapping by the second capacitor C2; and the third switch transistor M3 is switched on by the high level of the first node Q1, the signal output terminal OUT outputs the high level of the first clock signal terminal CLKA, and the level of the first node Q1 is further pulled up due to bootstrapping by the first capacitor C1.

Apparently the gate of the third switch transistor M3 remains at a high level so that the signal output terminal OUT can output the high level of the first clock signal terminal CLKA stably.

In the reset stage t3, the signal input terminal STU outputs a low level, the reset signal terminal STD outputs a high level, the first clock signal terminal CLKA outputs a low level, and the second clock signal terminal CLKB outputs a high level.

The fourth switch transistor M4 is switched on by the high level of the reset signal terminal STD, the eighth switch transistor M8 is switched off by the low level of the signal input terminal STU, and the gates of the fifth switch transistor M5 and the seventh switch transistor M7 are pulled up to the high level of the signal input terminal STD so that both the fifth switch transistor M5 and the seventh switch transistor M7 are switched on. Since the fifth switch transistor M5 is switched on, the high level of the reset signal terminal STD is written into the gate of the sixth switch transistor M6 so that the sixth switch transistor M6 is switched on, and the first node Q1 is pulled down to the low level of the signal input terminal STU, and thus reset.

The seventh switch transistor M7 is switched on so that the signal output terminal OUT is pulled down to the low level of the first DC signal terminal VGL, and thus reset.

The eleventh switch transistor M11 is switched off by the low level of the signal output terminal OUT, the twelfth switch transistor M12 is switched on by the high level of the second clock signal terminal CLKB, the level of the fifth node Q5 is pulled down to the low level of the first DC signal terminal VGL, and the level of the fifth node Q5 is further pulled down due to bootstrapping by the second capacitor C2, and thus reset.

In a subsequent period of time, the shift register repeats the operating process from t1 to t3 above.

It shall be noted that the respective embodiments of this disclosure have been described by way of an example in which the switch transistors are N-type transistors, and if the switch transistors are P-type transistors, then the same principle will apply, so a repeated description thereof will be omitted here.

Moreover, it shall be noted that in the shift register according to some embodiments of this disclosure, when all the switch transistors are N-type transistors, the first DC signal terminal is at a low level, and the second DC signal terminal is at a high level; and when all the switch transistors are P-type transistors, the first DC signal terminal is at a high level, and the second DC signal terminal is at a low level.

Based upon the same inventive idea, an embodiment of this disclosure provides a gate driver circuit including a plurality of concatenated shift registers above, where the signal input terminal of the first level of shift register is connected with a frame trigger signal terminal, and the signal input terminals of the respective other levels of shift registers than the first level of shift register are connected respectively with the concatenated signal output terminals of their preceding levels of shift register, and the reset signal terminals of the respective other levels of shift registers than the last level of shift register are connected respectively with the concatenated signal output terminals of their succeeding levels of shift registers.

Figure 11:
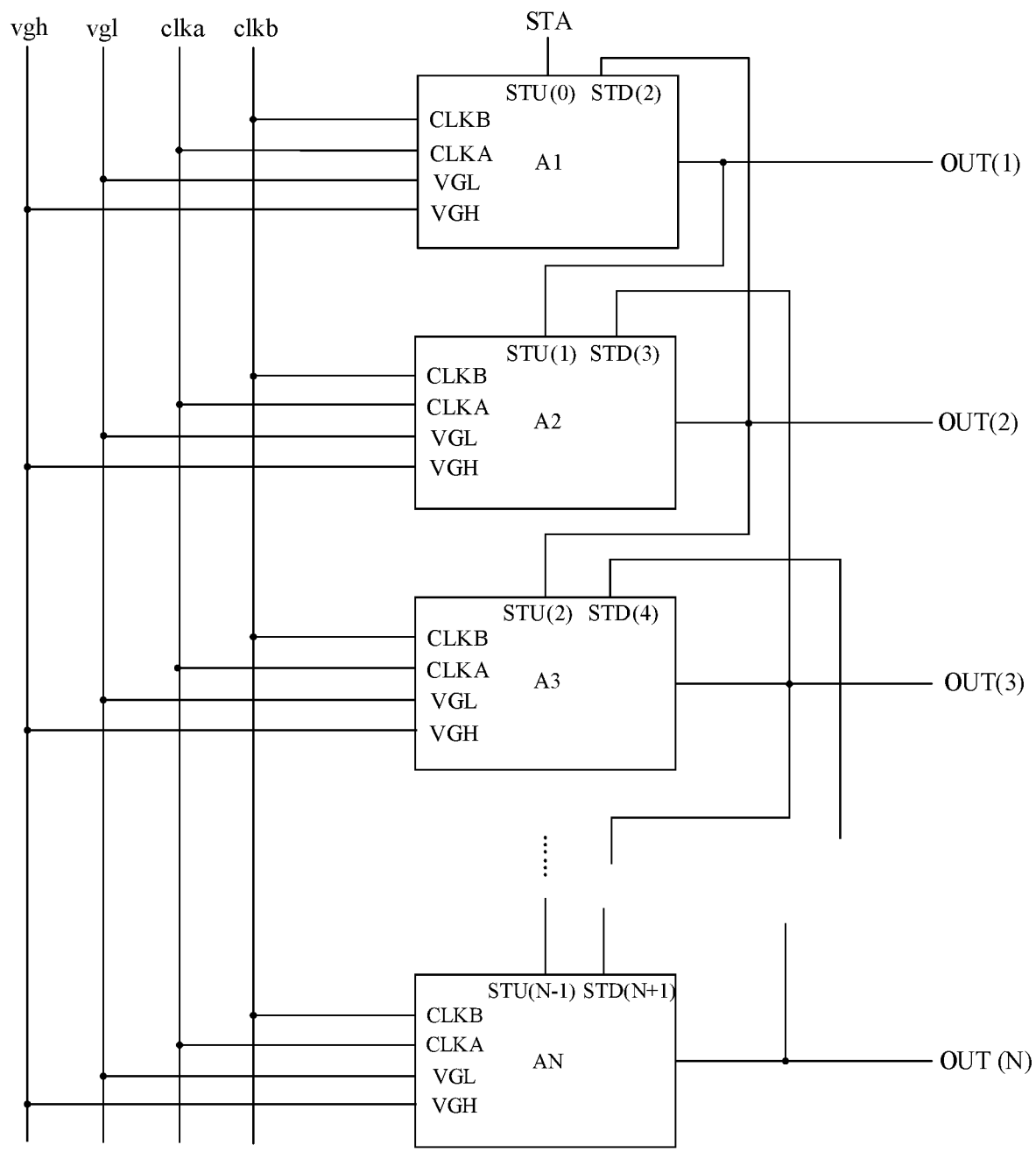
FIG. 11 is a schematic structural diagram of a gate driver circuit according to an embodiment of this disclosure.

Optionally, as illustrated in FIG. 11, the gate driver circuit includes N concatenated shift registers A1, A2, A3, . . . , AN, where the signal input terminal STU(M−1) of the shift register AM (1<M<N) is connected with the signal output terminal OUT(M−1) of the preceding level of shift register A(M−1), and the reset signal terminal STD(M+1) of the shift register AM is connected with the signal output terminal OUT(M+1) of the succeeding level of shift register A(M+1); and for example, the signal input terminal STU(1) of the second level of shift register A2 is connected with the signal output terminal OUT(1) of the preceding level of shift register A1, and the reset signal terminal STD(3) of the second level of shift register A2 is connected with the signal output terminal OUT(3) of the succeeding level of shift register A3. Optionally, the first level of shift register A1 takes a signal of the frame trigger signal terminal STA, i.e., an output signal of the preceding level of dummy element as an input signal of its signal input terminal STU(0); and the last level of shift register AN takes an output signal of the succeeding dummy unit as a reset signal of its reset signal terminal STD(N+1).

Optionally, the particular structure of each shift register in the gate driver circuit above can be functionally and structurally the same as the shift register above according to the respective embodiments of this disclosure, so a repeated description thereof will be omitted here.

In a particular implementation, in the gate driver circuit above according to some embodiments of this disclosure, as illustrated in FIG. 11, the first DC signal terminals VGL of the respective levels of shift registers are connected with a low-level signal line vgl, the second DC signal terminal VGH of the respective levels of shift registers are connected with a high-level signal line vgh, the first clock signal terminals CLKA of the respective levels of shift registers are connected with a first clock signal line clka, the second clock signal terminals CLKB of the respective levels of shift registers are connected with a second clock signal line clkb, and a clock signal on the first clock signal line clka is logically opposite to a clock signal on the second clock signal line clkb, that is, when a high level is output on the first clock signal line clka, a low level is output on the second clock signal line clkb, and when a low level is output on the first clock signal line clka, a high level is output on the second clock signal line clkb.

Based upon the same inventive idea, an embodiment of this disclosure further provides a display device including the gate driver circuit above according to some embodiments of this disclosure, and the display device can be a mobile phone, a tablet computer, a TV set, a monitor, a notebook computer, a digital camera, a navigator, a smart watch, a fitness wrist band, a personal digital assistant, an automatic teller machine, or any other product or component with a display function. All the other components indispensable to the display device shall readily occur to those ordinarily skilled in the art, so a repeated description thereof will be omitted here, and some embodiments of this disclosure will not be limited thereto. Reference can be made to some embodiments of the gate driver circuit above for an implementation of the display device, so a repeated description thereof will be omitted here.

It shall be noted that in this context, the relationship terms, e.g., the first, the second, etc., are merely intended to distinguish one entity or operation from another entity or operation, but will not necessarily require or suggest any such a real relationship between these entities or operations.

In the shift register, the method for driving the same, the gate driver circuit, and the display device above according to the embodiments of this disclosure, the shift register includes: an input module, a first reset module, a second reset module, and an output module where the input module is configured to write an input signal of the signal input terminal into the second node under the control of the second clock signal terminal, and to connect the second node with the first node under the control of the signal input terminal; the first reset module is configured to write a signal of the first DC signal terminal into the third node under the control of the signal input terminal, to write a reset signal of the reset signal terminal into the third node under the control of the reset signal terminal, and to connect the second node with the first node; the second reset module is configured to write the signal of the first DC signal terminal into the signal output terminal under the control of the third node; and the output module is configured to write a first clock signal of the first clock signal terminal into the signal output terminal under the control of the first node. The signal of the reset signal terminal can be avoided from interfering with the input signal, due to the arrangement of the first reset module.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A shift register, comprising: an input module, a first reset module, a second reset module, and an output module, wherein:

the input module is coupled respectively with a signal input terminal, a second clock signal terminal, a first node, and a second node, and configured to write an input signal of the signal input terminal into the second node under a control of the second clock signal terminal, and to connect the second node with the first node under a control of the signal input terminal;

the first reset module is coupled respectively with the signal input terminal, a first DC signal terminal, a reset signal terminal, the first node, the second node, and a third node, and configured to write a signal of the first DC signal terminal into the third node under a control of the signal input terminal, to write a reset signal of the reset signal terminal into the third node under a control of the reset signal terminal, and to connect the second node with the first node;

the second reset module is coupled respectively with a signal output terminal, the first DC signal terminal, and the third node, and configured to write the signal of the first DC signal terminal into the signal output terminal under a control of the third node; and the output module is coupled respectively with a first clock signal terminal, the signal output terminal, and the first node, and configured to write a first clock signal of the first clock signal terminal into the signal output terminal under a control of the first node;

the shift register further comprises an output control module, wherein:

the output control module is coupled respectively with the first node, the second clock signal terminal, the first DC signal terminal, and a second DC signal terminal; and the output control module is configured to pull up a level difference between the first node and the signal output terminal under a control of the second DC signal terminal, and to pull down the level difference between the first node and the signal output terminal under a joint control of the second clock signal terminal and the second DC signal terminal;

or, the shift register further comprises an output control module, wherein:

the output control module is coupled respectively with the first node, the second clock signal terminal, the first DC signal terminal, a second DC signal terminal, and the signal output terminal; and the output control module is configured to pull up a level difference between the first node and the signal output terminal under the control of the signal output terminal; and to pull down a level difference between the first node and the signal output terminal under the control of the second clock signal terminal.

2. The shift register according to claim 1, further comprises an anti-leakage module, wherein:

the anti-leakage module is coupled between the first clock signal terminal and the second node; and the anti-leakage module is configured to connect the first clock signal terminal with the second node under the control of the first clock signal terminal.

3. The shift register according to claim 2, wherein the anti-leakage module comprises a tenth switch transistor, wherein:

the tenth switch transistor has a gate and a first electrode, both of which are connected with the first clock signal terminal, and a second electrode connected with the second node.

4. The shift register according to claim 3, wherein the output control module comprises an eleventh switch transistor, a twelfth switch transistor, and a second capacitor, wherein:

the tenth switch transistor has a gate and a first electrode, both of which are connected with the first clock signal terminal, and a second electrode connected with the second node;

the eleventh switch transistor has a gate connected with the signal output terminal, a first electrode connected with the second DC signal terminal, and a second electrode connected with a second electrode of the twelfth switch transistor;

the twelfth switch transistor has a gate connected with the second clock signal terminal, and a first electrode connected with the first DC signal terminal; and the second capacitor is coupled between the first node, and the second electrode of the eleventh switch transistor.

5. The shift register according to claim 1, wherein the input module comprises a first switch transistor and a second switch transistor, wherein:

the first switch transistor has a gate connected with the second clock signal terminal, a first electrode connected with the signal input terminal, and a second electrode connected with the second node; and the second switch transistor has a gate connected with the signal input terminal, a first electrode connected with the second node, and a second electrode connected with the first node.

6. The shift register according to claim 1, wherein the output module comprises a third switch transistor and a first capacitor, wherein:

the third switch transistor has a gate connected with the first node, a first node connected with the first clock signal terminal, and a second electrode connected with the signal output terminal; and the first capacitor is coupled between the first node and the signal output terminal.

7. The shift register according to claim 1, wherein the first reset module comprises a fourth switch transistor, a fifth switch transistor, a sixth switch transistor, an eighth switch transistor, and a ninth switch transistor, wherein:

the fourth switch transistor has a gate and a first electrode, both of which are connected with the reset signal terminal, and a second electrode connected with the third node;

the fifth switch transistor has a gate connected with the third node, a first electrode connected with the reset signal terminal, and a second electrode connected with a fourth node;

the sixth switch transistor has a gate connected with the fourth node, a first electrode connected with the second node, and a second electrode connected with the first node;

the eighth switch transistor has a gate connected with the signal input terminal, a first electrode connected with the first DC signal terminal, and a second electrode connected with the third node;

the ninth switch transistor has a gate connected with the signal input terminal, a first electrode connected with the first DC signal terminal, and a second electrode connected with the fourth node; and a width to length ratio of the eighth switch transistor is greater than that of the fourth switch transistor.

8. The shift register according to claim 1, wherein the second reset module comprises a seventh switch transistor, wherein:

the seventh switch transistor has a gate connected with the third node, a first electrode connected with the first DC signal terminal, and a second electrode connected with the signal output terminal.

9. The shift register according to claim 1, wherein the output control module comprises an eleventh switch transistor, a twelfth switch transistor, and a second capacitor, wherein:
the eleventh switch transistor has a gate and a first electrode, both of which are connected with the second DC signal terminal, and a second electrode connected with a second electrode of the twelfth switch transistor;
the twelfth switch transistor has a gate connected with the second clock signal terminal, and a first electrode connected with the first DC signal terminal;
the second capacitor is coupled with the first node, and the second electrode of the eleventh switch transistor; and
a width to length ratio of the twelfth switch transistor greater than that of the eleventh switch transistor.

10. A gate driver circuit, comprising a plurality of concatenated shift registers according to claim 1, wherein:
a signal input terminal of the first level of shift register is connected with a frame trigger signal terminal;
signal input terminals of other levels of shift registers than a first level of shift register are connected respectively with the signal output terminals of their immediately preceding levels of shift register; and
reset signal terminals of other levels of shift registers than a last level of shift register are connected respectively with the signal output terminals of their immediately succeeding levels of shift registers.

11. A display device, comprising the gate driver circuit according to claim 10.

12. A method for driving the shift register according to claim 1, the method comprising:
in an input stage, writing, by the input module, the input signal of the signal input terminal into the second node under the control of the second clock signal terminal, and connecting the second node with the first node under the control of the signal input terminal to write the input signal of the signal input terminal into the first node through the second node; writing, by the first reset module, the signal of the first DC signal terminal into the third node under the control of the signal input terminal; and writing, by the output module, the first clock signal of the first clock signal terminal into the signal output terminal under the control of the first node;
in an output stage, writing, by the output module, the first clock signal of the first clock signal terminal into the signal output terminal under the control of the first node; and
in a reset stage, writing, by the input module, the input signal of the signal input terminal into the second node under the control of the second clock signal terminal; writing, by the first reset module, the reset signal of the reset signal terminal into the third node, and connecting the second node with the first node, under the control of the reset signal terminal; and writing, by the second reset module, the signal of the first DC signal terminal into the signal output terminal under the control of the third node;
the method further comprises:
in the output stage, pulling up, by the output control module, a level difference between the first node and the signal output terminal;
in the reset stage, pulling down, by the output control module, the level difference between the first node and the signal output terminal.

* * * * *